United States Patent
Shimizu et al.

(10) Patent No.: US 6,822,912 B2
(45) Date of Patent: Nov. 23, 2004

(54) SEMICONDUCTOR DEVICE

(75) Inventors: Hiroshi Shimizu, Kawasaki (JP); Wataru Yokozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 14 days.

(21) Appl. No.: 10/448,003

(22) Filed: May 30, 2003

(65) Prior Publication Data
US 2004/0001384 A1 Jan. 1, 2004

(30) Foreign Application Priority Data
Jun. 28, 2002 (JP) ........................................ 2002-190800

(51) Int. Cl.$^7$ ................................................ G11C 7/00
(52) U.S. Cl. ................ 365/200; 365/225.7; 365/230.06
(58) Field of Search ............................ 365/200, 225.7, 365/230.03, 230.06

(56) References Cited

U.S. PATENT DOCUMENTS 5,208,782 A * 5/1993 Sakuta et al. .......... 365/230.03
6,282,145 B1 * 8/2001 Tran et al. ............. 365/230.06

OTHER PUBLICATIONS

Japanese patent application publication No. 2000–114384, dated Apr. 21, 2000.

* cited by examiner

Primary Examiner—Gene N. Auduong
(74) Attorney, Agent, or Firm—Arent Fox, PLLC.

(57) ABSTRACT

A semiconductor device that includes macro cells and a fuse of smaller size. Each macro cell includes normal blocks and a redundant block. Each normal block includes circuits each having a predetermined function. The redundant block has the same function as the normal blocks have. If one of the normal blocks does not work well, it will be replaced with the redundant block. The fuse holds information for specifying the normal block to be replaced with the redundant block included in the macro cell. This fuse is shared by a plurality of macro cells.

7 Claims, 15 Drawing Sheets

SEMICONDUCTOR DEVICE

CROSS-REFERENCE TO RELATED APPLICATIONS

This application is based upon and claims priority of Japanese Patent Application No. 2002-190800, filed on Jun. 28, 2002, the contents being incorporated herein by reference.

BACKGROUND OF THE INVENTION (1) Field of the Invention

This invention relates to a semiconductor device and, more particularly, to a semiconductor device having a macro cell including a plurality of macro cells and a fuse, and a fuse.

(2) Description of the Related Art

For example, with semiconductor devices, such as memories, the following method has been adopted. A cell array is divided into a plurality of blocks. If one block does not work well, another block is used in place of this block. By adopting this method, yields can be raised.

FIG. 14 is a view showing an example of this conventional method.

In FIG. 14, a semiconductor device 10 comprises macro cells 10a through 10d, fuses 10e through 10h, and connection lines 10i through 10l.

The macro cell 10a includes, for example, a cell array divided into a plurality of blocks. One of the blocks is a redundant block and the rest are normal blocks.

All of the fuses 10e through 10h have the same structure. Description will be given with the fuse 10e as an example. As shown in FIG. 15, the fuse 10e includes a pull-up resistor 20, a connection section 21, a fuse element group 22, and a decoder 23. If a predetermined normal block included in the macro cell 10a does not work well, the normal block to be replaced is specified by fusing a fuse element included in the fuse element group 22 into a predetermined pattern by the use of a laser beam.

Now, operation performed in the above conventional method will be described. Description will be given on the assumption that each of the macro cells 10a through 10d includes ten normal blocks and one redundant block.

It is assumed that a first normal block in the macro cell 10a does not work well, that a third normal block in the macro cell 10c does not work well, and that the remaining macro cells 10b and 10d are normal.

Then a fuse in the fuse 10e corresponding to the first normal block in the macro cell 10a is fused by the use of a laser beam and a fuse in the fuse 10g corresponding to the third normal block in the macro cell 10c is fused by the use of a laser beam.

As a result, in the fuse 10e output from the fuse fused goes into the "L" state and output from the other fuses goes into the "H" state. The decoder 23 decodes these signals output from the fuse element group 22 and supplies them to the macro cell 10a.

In the macro cell 10a, the first normal block is replaced with a redundant block in response to a signal supplied from the decoder 23 in the fuse 10e. As a result, the first normal block is excepted and the redundant block is used instead. The macro cell 10a therefore can operate normally.

The same operation will be performed in the fuse 10g and macro cell 10c, so that the third normal block is replaced with a redundant block. The macro cell 10c therefore can operate normally.

The macro cells 10b and 10d are normal, so replacement will not be made.

By the way, in recent years the process for fabricating semiconductor devices has become minuter, so the size of the macro cells 10a through 10d tends to reduce. On the other hand, individual fuses in the fuses 10e through 10h must be located at moderate intervals because they must be fused selectively by the use of a laser beam. Therefore, though the size of the macro cells 10a through 10d is reduced by adopting a minute process, the size of the fuses 10e through 10h is not reduced. This is a bottleneck in reducing the entire size of the semiconductor device.

SUMMARY OF THE INVENTION

The present invention was made under the background circumstances as described above. An object of the present invention is to make it possible to reduce the size of a semiconductor device having a plurality of macro blocks and a fuse.

In order to achieve the above object, a semiconductor device comprising a plurality of macro cells each including a plurality of normal blocks each including circuits each having a predetermined function and a redundant block having the same function as the normal blocks have and used, in the case of one of the normal blocks not working well, in place of the normal block and a fuse shared by the plurality of macro cells for holding information for specifying the normal block to be replaced with the redundant block included in the macro cell is provided.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
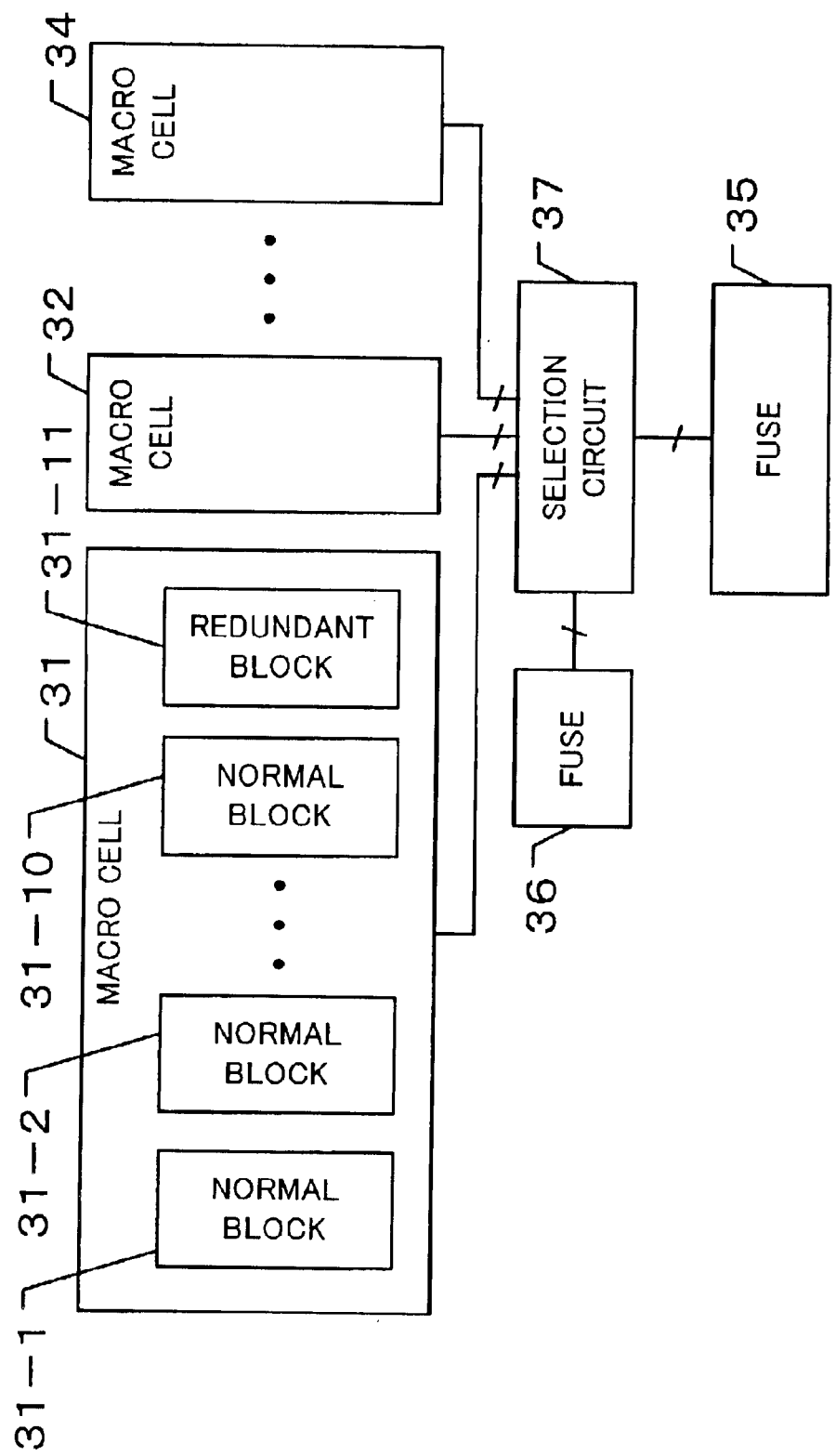
FIG. 1 is a view for describing the principles underlying operation in the present invention.

FIG. 1 is a view for describing the principles underlying operation in the present invention. As shown in FIG. 1, a semiconductor device according to the present invention comprises macro cells 31 through 34, fuses 35 and 36, and a selection circuit 37.

All of the macro cells 31 through 34 have the same structure. Description will be given with the macro cell 31 as an example. The macro cell 31 includes normal blocks 31-1 through 31-10 and a redundant block 31-11.

Each of the normal blocks 31-1 through 31-10 includes, for example, a cell array. The redundant block 31-11 includes the same cell array as each of the normal blocks 31-1 through 31-10 includes. If one of the normal blocks 31-1 through 31-10 does not work well, the redundant block 31-11 will operate in place of the normal block.

The fuse 35 includes a plurality of fuse elements, a decoder, etc. By fusing one of the fuse elements by the use of a laser beam, a normal block to be replaced with the redundant block is specified.

The fuse 36 includes a plurality of fuse elements, a decoder, etc. This is the same with the fuse 35. By fusing a predetermined fuse element by the use of a laser beam, a macro cell to be connected to the fuse 35 is specified.

The selection circuit 37 selectively connects one of the macro cells 31 through 34 and the fuse 35 according to the state of the fuse 36.

Now, operation in FIG. 1 will be described. Hereinafter it is assumed that only the normal block 31-2 in the macro cell 31 of the macro cells 31 through 34 does not work well.

If the fact that the normal block 31-2 in the macro cell 31 does not work well has become known after the semiconductor device being produced, a predetermined fuse element in the fuse 36 is fused first by the use of a laser beam.

In this example, the semiconductor device includes the four macro cells 31 through 34. To select one of these macro cells, the fuse 36 should include at least two fuse elements. For example, to select the macro cell 31, one of the two fuse elements corresponding to a low-order bit is fused and "1" is represented. By doing so, the macro cell 31 will be selected by the selection circuit 37.

After the fuse 36 is fused, the fuse 35 is fused. In this example, the macro cell 31 includes the ten normal blocks 31-1 through 31-10. To specify one of these normal blocks, the fuse 35 should include at least four fuse elements. To specify the normal block 31-2, one of the four fuse elements corresponding to the second least significant bit should be fused by the use of a laser beam.

When the fusing of predetermined fuse elements in the fuses 35 and 36 is completed in this way, the selection circuit 37 selects the macro cell 31 according to the connection state in the fuse 36 and connects it to the fuse 35. The internal connection state of the macro cell 31 is changed according to the connection state in the fuse 35 so that the normal block 31-2 will be replaced with the redundant block. As a result, the normal block 31-2 is not used and is replaced with the redundant block 31-11. Therefore, the semiconductor device can operate normally.

As described above, in the present invention the fuse 35 is shared by the plurality of macro cells 31 through 34. Therefore, the size of a semiconductor device can be reduced compared with a case where there is one fuse for each macro cell.

The above structure cannot cope with a case where a plurality of macro cells do not work well concurrently. However, the probability that a plurality of macro cells will not work well concurrently is sufficiently low, so this does not matter.

Now, a first embodiment of the present invention will be described.

Figure 2:
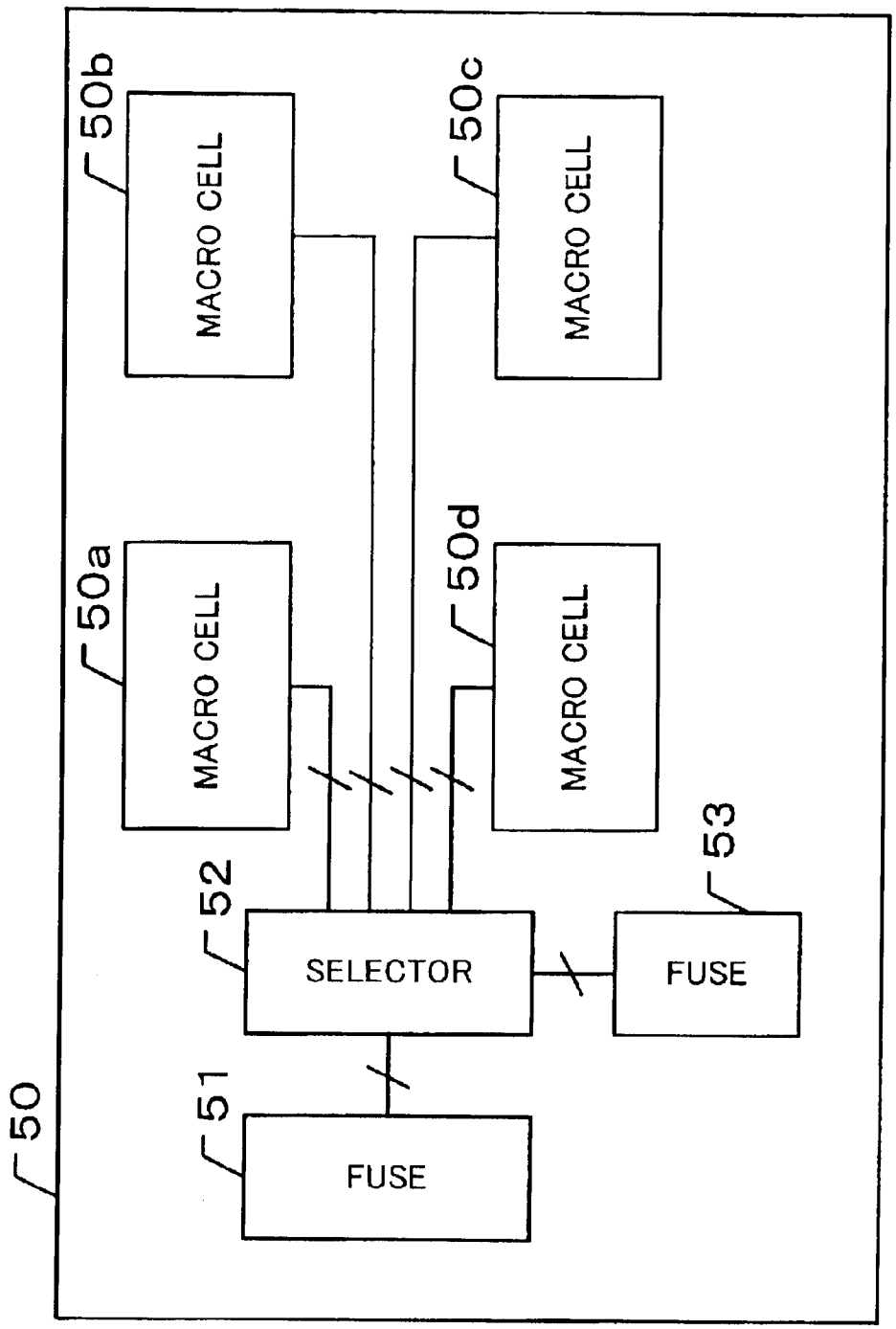
FIG. 2 is a view showing the structure of a first embodiment of the present invention.

FIG. 2 is a view showing the structure of a first embodiment of the present invention. As shown in FIG. 2, a semiconductor device 50 according to the first embodiment of the present invention comprises macro cells 50a through 50d, a fuse 51, a selector 52, and a fuse 53.

The fuse 51 includes a plurality of fuse elements etc. A fuse element in the fuse 51 is fused into a predetermined pattern. By doing so, a normal block to be replaced with a redundant block, which does not work well and which is included in one of the macro cells 50a through 50d, is specified.

The selector 52 selectively connects the fuse 51 to one of the macro cells 50a through 50d according to the state of the fuse 53.

The fuse 53 includes a plurality of fuse elements. This is the same with the fuse 51. More than one fuse element in the fuse 53 is fused into a predetermined pattern. By doing so, the fuse 51 is selectively connected to one of the macro cells 50a through 50d.

Each of the macro cells 50a through 50d includes a cell array having normal blocks and a redundant block. A normal block which does not work well will be replaced with the redundant block.

Figure 3:
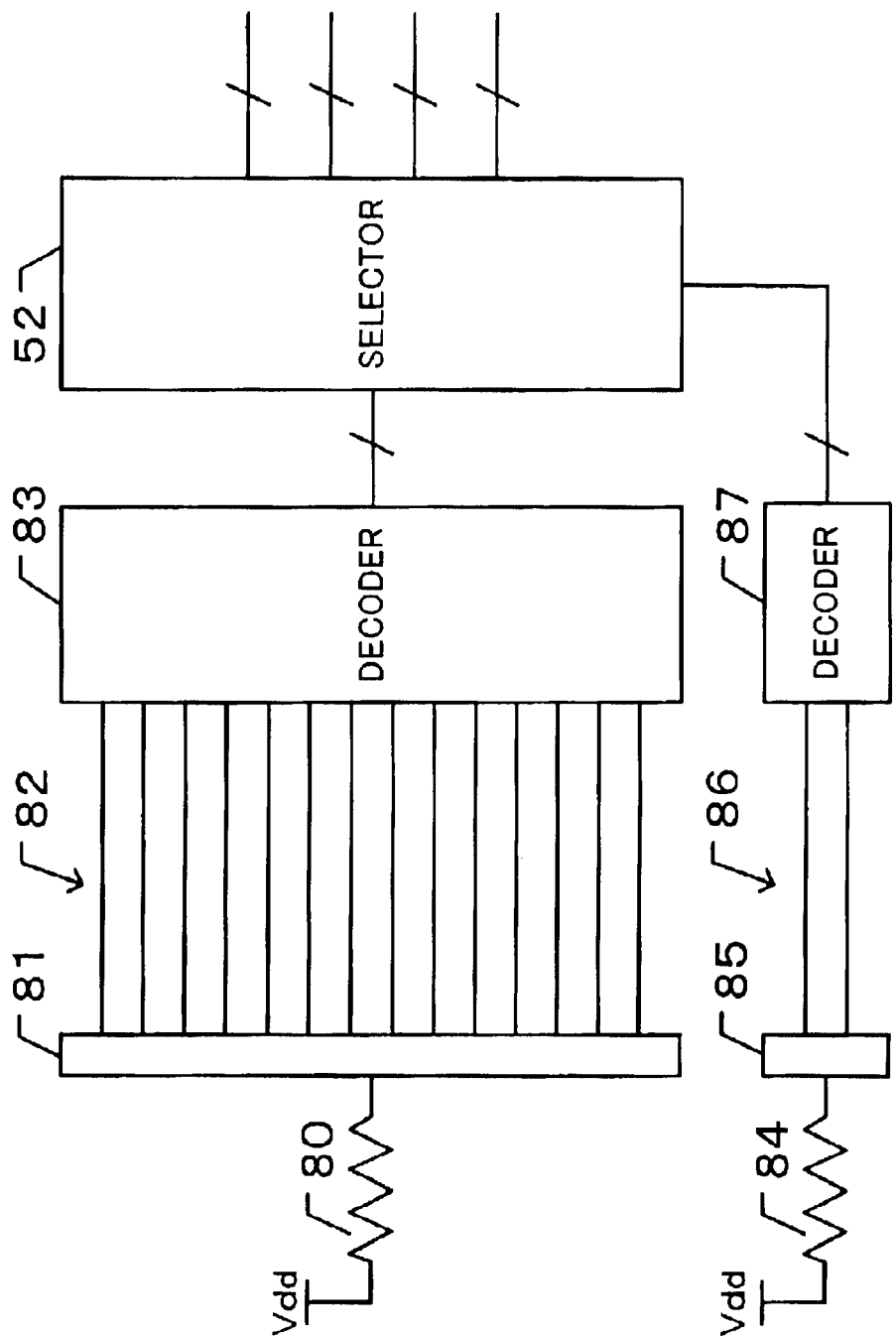
FIG. 3 is a view showing the structure of the fuses and selector shown in FIG. 2.

FIG. 3 is a detailed view showing the structure of the fuses 51 and 53. As shown in FIG. 3, the fuse 51 includes a pull-up resistor 80, a connection section 81, a fuse element group 82, and a decoder 83. The fuse 53 includes a pull-up resistor 84, a connection section 85, a fuse element group 86, and a decoder 87.

The pull-up resistor 80 supplies power supply voltage Vdd to the fuse element group 82 via the connection section 81 to pull it up.

The connection section 81 connects the fuse element group 82 and the pull-up resistor 80.

In this example, the fuse element group 82 includes fourteen fuse elements. The fuse element group 82 is fused into a predetermined pattern. By doing so, a normal block to be replaced with a redundant block is specified.

The decoder 83 decodes a fusing pattern formed in the fuse element group 82, converts it to a parallel signal, and supplies the signal to the selector 52 as a redundant block selection signal.

The pull-up resistor 84 supplies power supply voltage Vdd to the fuse element group 86 via the connection section 85 to pull it up.

The connection section 85 connects the fuse element group 86 and the pull-up resistor 84.

In this example, the fuse element group 86 includes two fuse elements. The fuse element group 86 is fused into a predetermined pattern. By doing so, a macro cell to which output from the decoder 83 is supplied is selected.

The decoder 87 decodes a fusing pattern formed in the fuse element group 86, converts it to a parallel signal, and supplies the signal to the selector 52.

The selector 52 decodes data supplied from the decoder 87, selects a macro cell specified by the data, and supplies data (redundant block selection signal) supplied from the decoder 83 to the macro cell it selected.

Figure 4:
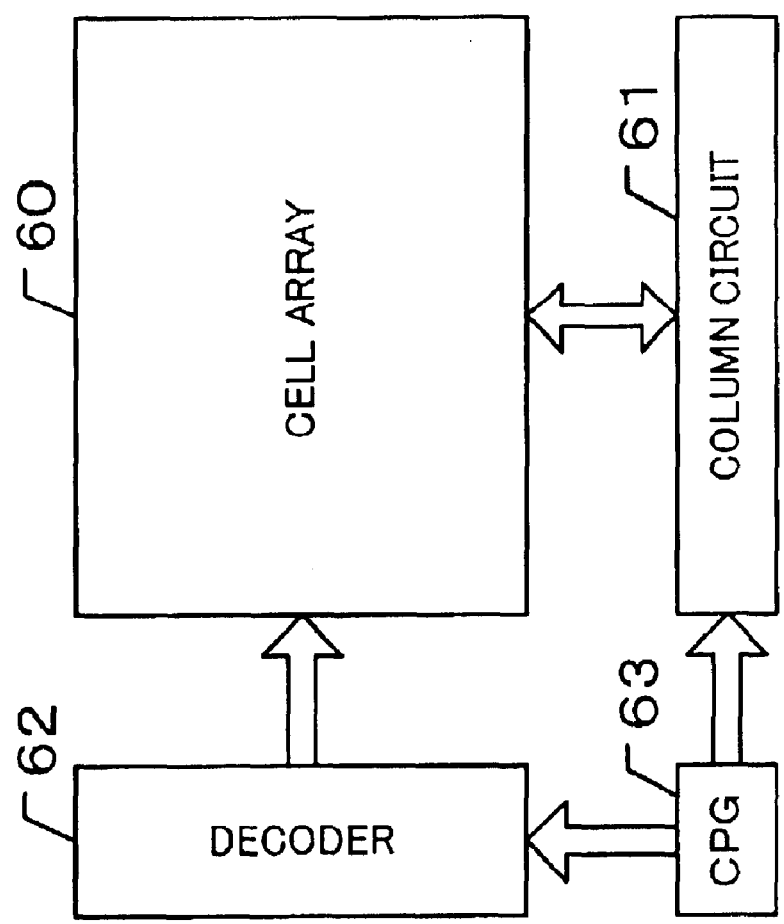
FIG. 4 is a view showing the structure of the macro cells shown in FIG. 2.

FIG. 4 is a detailed view showing the structure of the macro cells 50a through 50d. As shown in FIG. 4, each of the macro cells 50a through 50d includes a cell array 60, a column circuit 61, a decoder 62, and a clock pulse generator (CPG) 63.

The cell array 60 includes a plurality of memory cells arranged like an array and can store data. As described later, the cell array 60 is divided into a plurality of normal blocks and a redundant block. If a normal block does not work well, it will be replaced with the redundant block.

The column circuit 61 includes a sense amplifier etc. The column circuit 61 writes data to or reads data from a predetermined column in the cell array. Moreover, if there is a normal block which does not work well, the column circuit 61 performs the process of replacing it with a redundant block.

The decoder 62 selects a cell group where data will be written or read by a word line according to address data input.

The CPG 63 generates an internal clock signal by, for example, dividing the frequency of a clock signal supplied from the outside and supplies it to the column circuit 61 and decoder 62.

Figure 5:
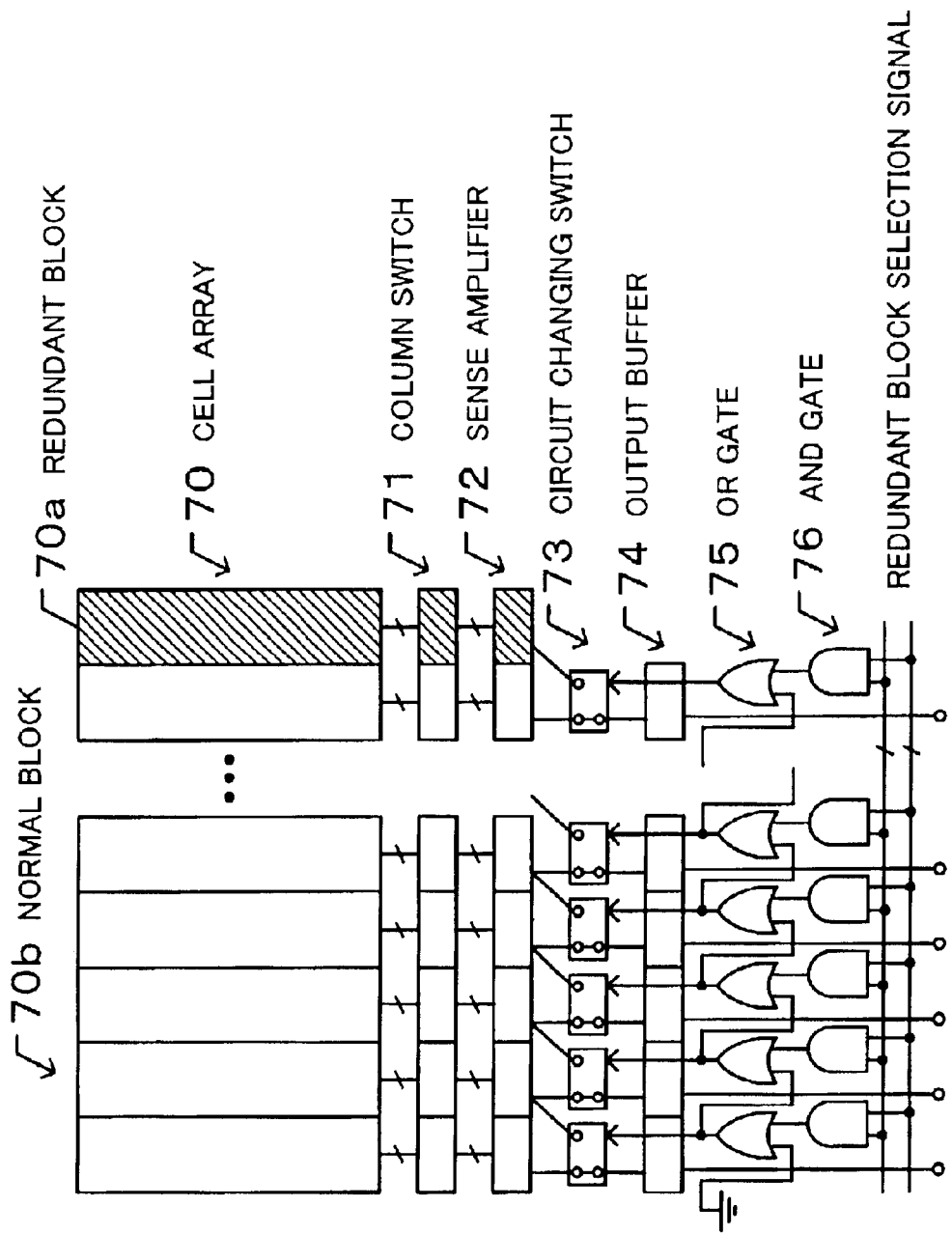
FIG. 5 is a more detailed view showing the structure of the macro cell shown in FIG. 4.

FIG. 5 is a detailed view showing the structure of the cell array 60 and column circuit 61 shown in FIG. 4.

As shown in FIG. 5, a cell array 70 corresponds to the cell array 60 and the column circuit 61 includes a column switch (SW) 71, a sense amplifier 72, a circuit changing switch (SW) 73, an output buffer 74, an OR gate 75, and an AND gate 76.

The cell array 70 includes one redundant block 70a and a plurality of normal blocks 70b.

The column SW 71 is used to select output from each column.

The sense amplifier 72 is used to amplify a signal output from a bit line in the cell array 70.

If there is a need to replace a normal block with a redundant block, the circuit changing SW 73 selects the next block. If there is no need to replace a normal block with a redundant block, the circuit changing SW 73 selects the block just over it.

The output buffer 74 latches data output from the circuit changing SW 73.

The OR gate 75 finds the logical sum of output from the next OR gate on the left side and output from the AND gate just under it and outputs it. The leftmost OR gate finds the logical sum of output from the AND gate just under it and the ground potential "L" and outputs it.

The AND gate 76 finds the logical product of redundant block selection signals and outputs it.

Now, operation in the first embodiment will be described.

It is assumed that the fact that a third normal block 70b (the third normal block from the left) in the macro cell 50a shown in FIG. 5 does not work well has become known. Then the fuse element group 86 is fused first into a predetermined pattern by the use of a laser beam to select the macro cell 50a from among the macro cells 50a through 50d.

The fuse element group 82 is also fused into a predetermined pattern to specify the third normal block.

For example, only a fuse element in the fuse element group 86 corresponding to a low-order bit is fused by the use of a laser beam so that "1" indicative of the macro cell 50a will be obtained. On the other hand, fuse elements in the fuse element group 82 corresponding to two low-order bits are fused by the use of a laser beam so that "3" indicative of the third normal block will be obtained.

As a result, the fuse element in the fuse element group 86 corresponding to a low-order bit goes into the "L" state. The other fuse element in the fuse element group 86 is pulled up by the pull-up resistor 84 and goes into the "H" state. The decoder 87 supplies data corresponding to these states to the selector 52.

On the other hand, output from each of the fuse elements in the fuse element group 82 corresponding to two low-order bits goes into the "L" state and output from each of the other fuse elements in the fuse element group 82 goes into the "H" state. The decoder 83 supplies data corresponding to these states as a redundant block selection signal.

The selector 52 selects a macro cell corresponding to the data supplied from the decoder 87 and supplies the data supplied from the decoder 83. In this example, only the fuse element in the fuse element group 86 corresponding to a low-order bit is fused. Therefore, the selector 52 selects the macro cell 50a and supplies the data output from the decoder 83.

In the macro cell 50a, the data output from the decoder 83 (redundant block selection signal) is supplied to the AND gate 76.

On the basis of the redundant block selection signal, output from the AND gate 76 just under a normal block which must be replaced (normal block which does not work well) goes into the "H" state and output from the other AND gates 76 goes into the "L" state. In this example, the third normal block (the third normal block from the left) in FIG. 5 does not work well, so only output from the third AND gate 76 from the left goes into the "H" state.

Then output from the third OR gate 75 from the left goes into the "H" state. An OR gate 75 located to the right of the third OR gate 75 accepts output from the next OR gate 75 on the left side as input, so output from all the OR gates 75 located to the right of the third OR gate 75 goes into the "H" state.

A signal output from an OR gate 75 is input to a circuit changing SW 73 just above it. If this signal is in the "L" state, then the circuit changing SW 73 selects a normal block (or the redundant block) just above it. If this signal is in the "H" state, then the circuit changing SW 73 selects the next normal block (or redundant block) on the right side of the normal block just above it. In this example, output from the first OR gate 75 is in the "L" state and output from the second OR gate 75 is also in the "L" state. Therefore, the first normal block 70b is connected to an output buffer 74 just under it. The second normal block 70b is also connected to an output buffer 74 just under it. Output from the third OR gate 75 is in the "H" state and output from each of the OR gates 75 located to the right of the third OR gate 75 is in the "H" state. Therefore, the next fourth normal block 70b on the right side of the third normal block is connected to the third output buffer 74. Similarly, each of the output buffers 74 located to the right of the third output buffer 74 and the next normal block 70b on the right side of the normal block just above it are connected. The redundant block 70a will be connected to the rightmost output buffer 74. That is to say, each output buffer 74 and the next normal block (or redundant block) on the right side of the normal block just above it are connected with the third normal block 70b skipped. As a result, the third normal block 70b which does not work well will be replaced with the redundant block 70a.

After the fuse element groups 82 and 86 are fused, the same operation will be performed each time power is applied. That is to say, the third normal block which does not work well will be replaced.

As described above, in the first embodiment of the present invention the fuse 51 is shared by the plurality of macro cells 50a through 50d. Therefore, the size of a chip can be reduced compared with a case where there is one fuse for each of the macro cells 50a through 50d.

Furthermore, in the first embodiment of the present invention, the fuse 53 is included for selecting one of the macro cells 50a through 50d and one of the macro cells 50a through 50d is selected according to the state of the fuse 53. Therefore, after the fuse 53 being fused, replacement will be made automatically at the time of power being applied.

In the above embodiment the new fuse 53 must be added. However, the number of fuse elements included in the fuse 53 is smaller than that of fuse elements included in the fuse 51. Therefore, the area of a chip can be reduced compared with a case where there is one fuse 51 for each macro cell.

In addition, in the above embodiment, a case where a plurality of macro cells do not work well at the same time cannot be coped with. However, the probability that a plurality of macro cells will not work well concurrently is sufficiently low, so a yield drop caused by this is negligible.

Now, a second embodiment of the present invention will be described.

Figure 6:
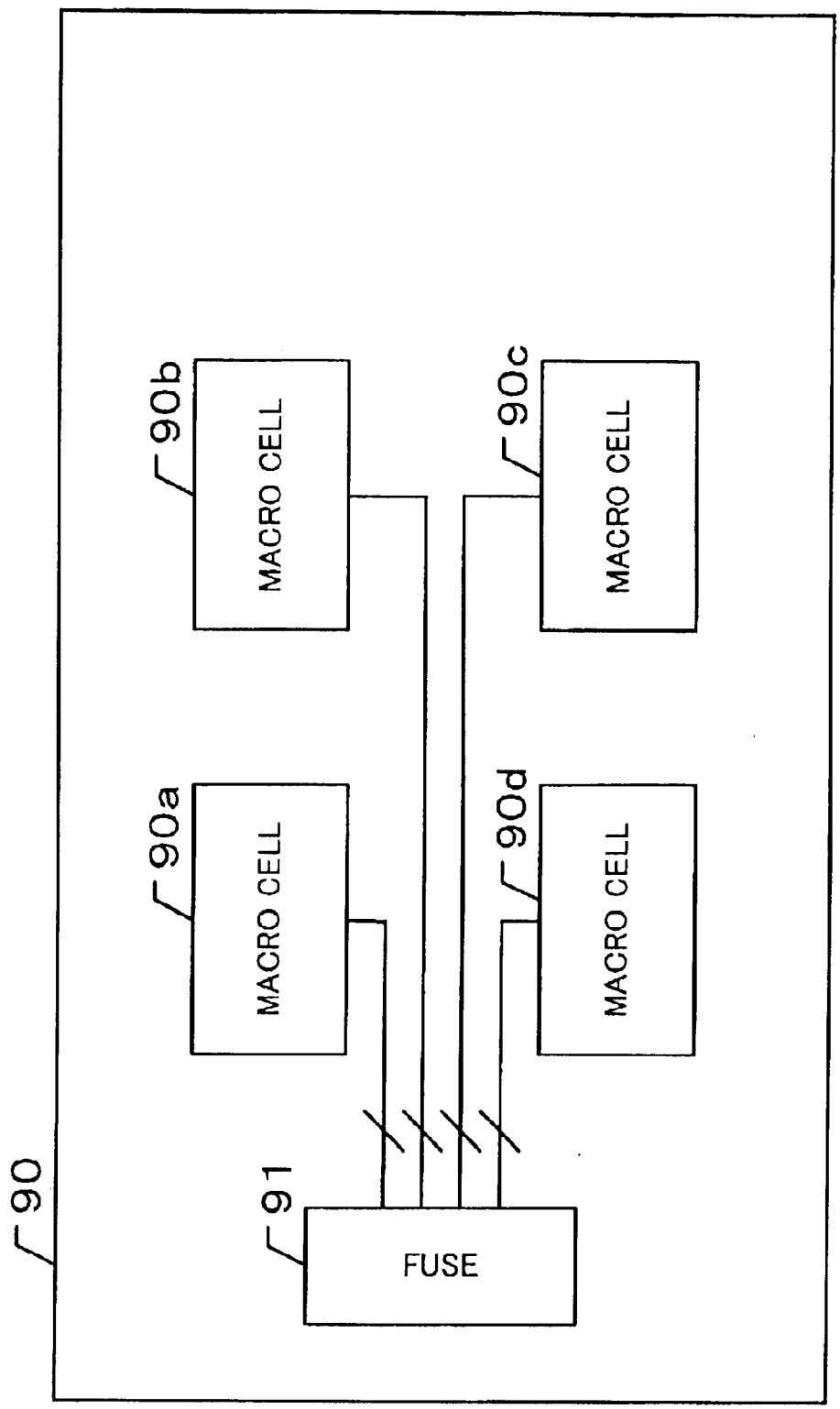
FIG. 6 is a view showing the structure of a second embodiment of the present invention.

FIG. 6 is a view showing the structure of a second embodiment of the present invention. As shown in FIG. 6, a semiconductor device 90 according to the second embodiment of the present invention comprises macro cells 90a through 90d and a fuse 91.

The structure of each of the macro cells 90a through 90d is the same as that shown in FIGS. 4 and 5, so detailed descriptions of them will be omitted.

Figure 7:
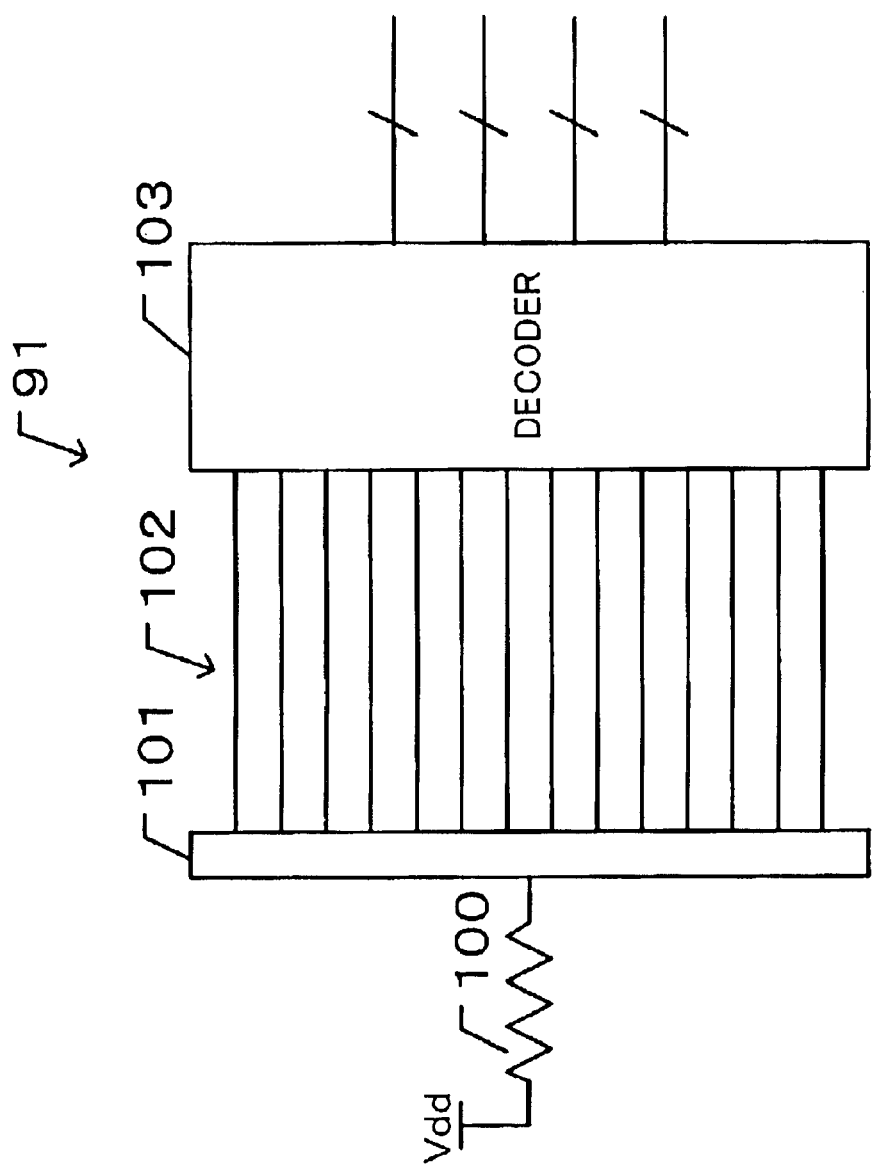
FIG. 7 is a view showing the structure of the fuse shown in FIG. 6.

As shown in FIG. 7, the fuse 91 includes a pull-up resistor 100, a connection section 101, a fuse element group 102, and a decoder 103. Output from the decoder 103 is supplied to all of the macro cells 90a through 90d.

Now, operation in the second embodiment of the present invention will be described.

Figure 8:
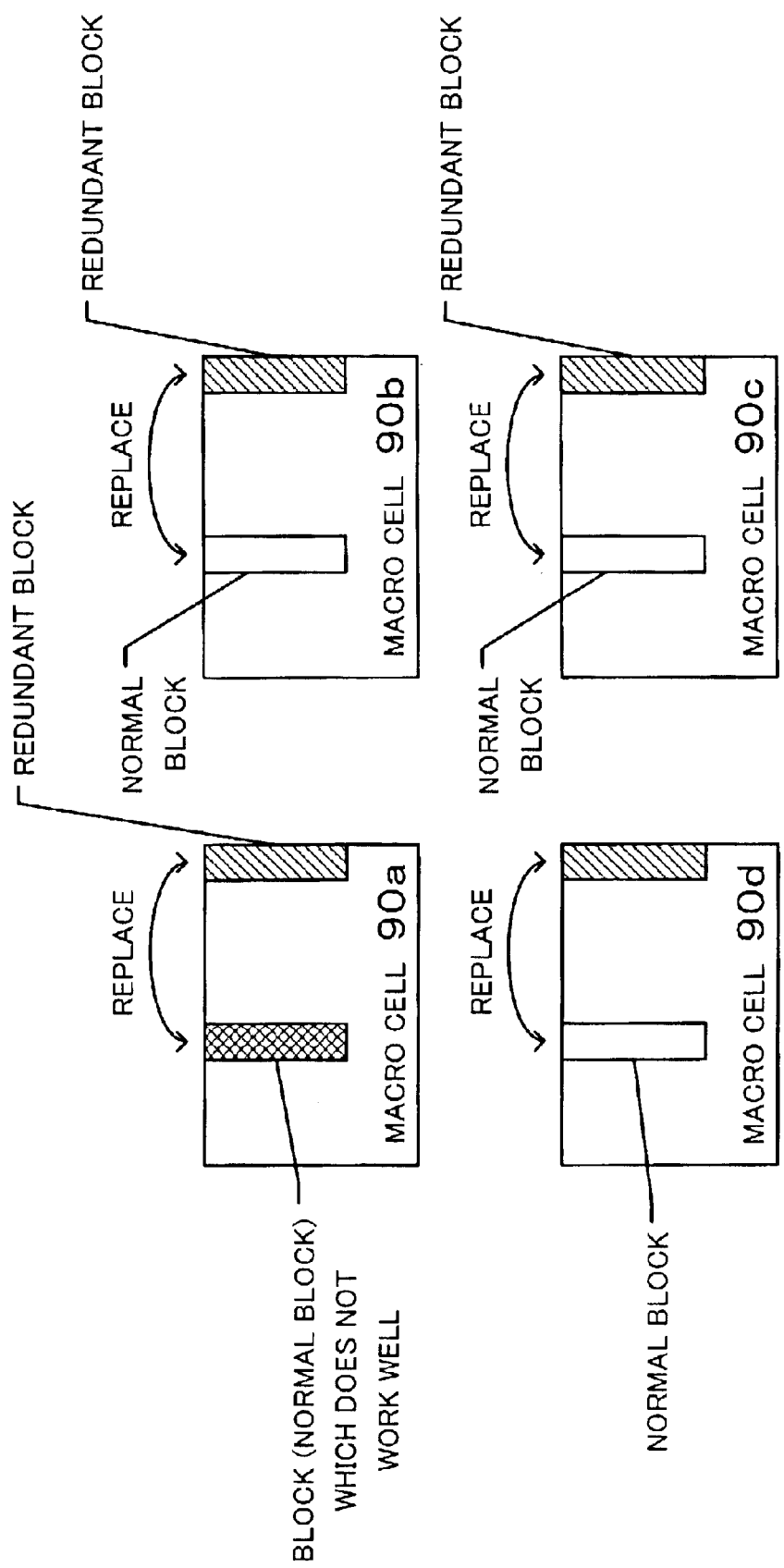
FIG. 8 is a view for describing the principles underlying operation in the second embodiment shown in FIG. 6.

As shown in FIG. 8, it is assumed that a predetermined normal block (a fourth normal block, for example) in the macro cell 90a does not work well and that all normal blocks in the macro cells 90b through 90d work normally.

Then fuse elements in the fuse element group 102, shown in FIG. 7, corresponding to three low-order bits are fused by the use of a laser beam so that "4" indicative of the fourth normal block will be specified. As a result, output from each of the fuse elements corresponding to three low-order bits goes into the "L" state and output from each of the other fuse elements goes into the "H" state.

The decoder 103 generates data corresponding to the state of the fuse element group 102 and supplies the same data to all of the macro cells 90a through 90d as a redundant block selection signal.

In consequence, as shown in FIG. 8, the fourth normal block will be replaced with a redundant block in each of the macro cells 90a through 90d. The fourth normal block in the macro cell 90a which does not work well is replaced, so the macro cell 90a can operate normally. Replacement will be made in the same way in the macro cells 90b through 90d.

However, the macro cells 90b through 90d operate normally without a change and will not get out of order as a result of the replacement.

The above description has been given on the assumption that the structure of each of the macro cells 90a through 90d is the same. However, the macro cells 90a through 90d may differ in block structure.

For example, the macro cells 90a through 90d may differ in depth of block address. That is to say, the macro cell 90a may include 2 kW×8 blocks and the macro cell 90b may include 1 kW×8 blocks.

Moreover, the macro cells 90a through 90d may differ in number of blocks. That is to say, the macro cell 90a may include 2 kW×4 blocks and the macro cell 90b may include 2 kW×8 blocks. In this case, the decoder 103 shown in FIG. 7 must have a function to accommodate a macro cell which includes the largest number of blocks.

As described above, in the second embodiment of the present invention, the fuse 91 is shared by the macro cells 90a through 90d. Therefore, the size of a chip can be reduced compared with a case where there is one fuse for each of the macro cells 90a through 90d. Furthermore, the selector 52 and fuse 53 included in the first embodiment are unnecessary and the size of a chip can be reduced further by that much.

In the second embodiment of the present invention, a case where a plurality of macro cells do not work well at the same time cannot be coped with. This is the same with the first embodiment. As described above, however, the probability that a plurality of macro cells will not work well concurrently is sufficiently low, so the possibility of a yield drop will be remote.

Now, a third embodiment of the present invention will be described.

Figure 9:
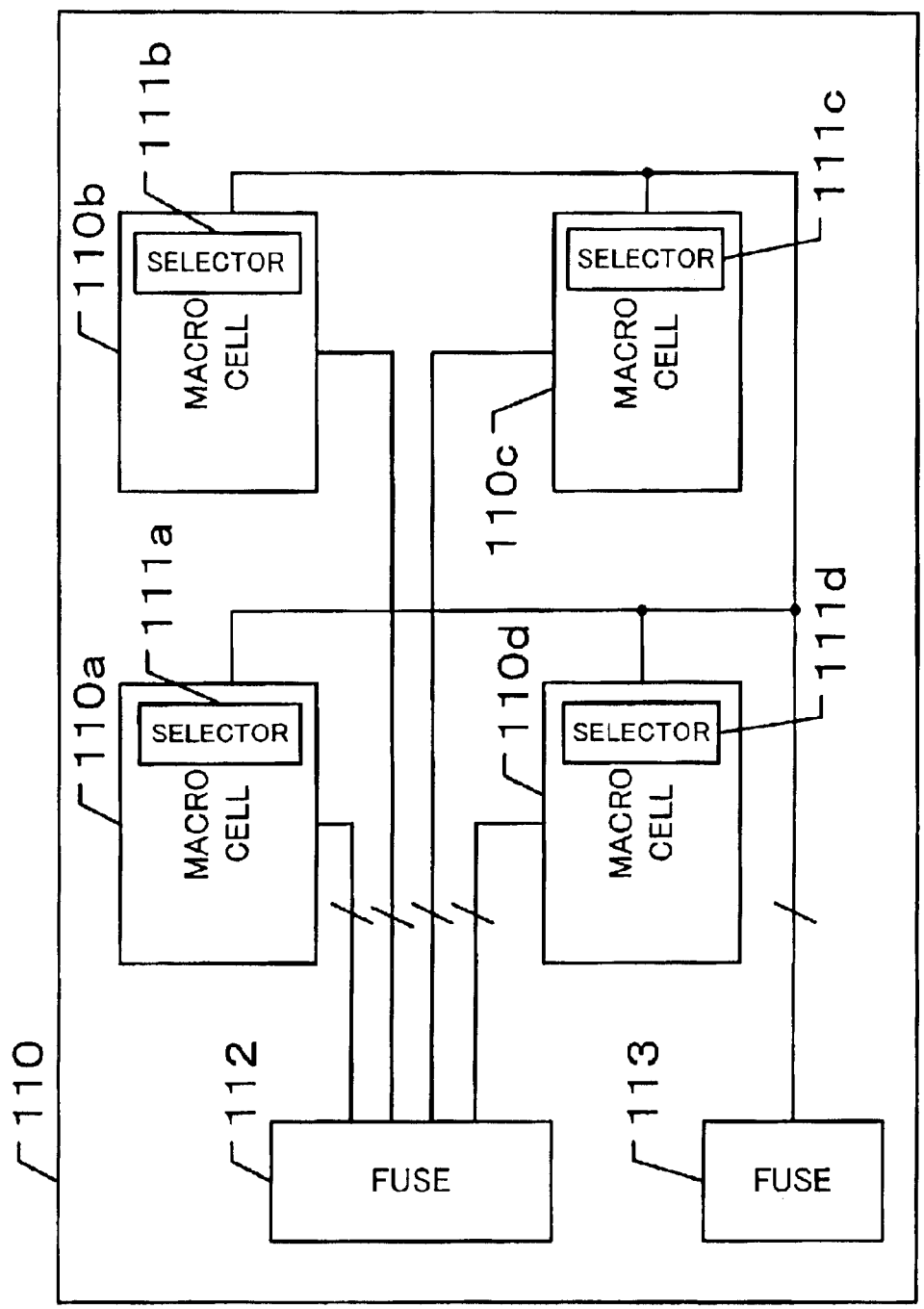
FIG. 9 is a view showing the structure of a third embodiment of the present invention.

FIG. 9 is a view showing the structure of a third embodiment of the present invention. As shown in FIG. 9, the third embodiment of the present invention comprises macro cells 110a through 110d and fuses 112 and 113.

The macro cells 110a through 110d include built-in selectors 111a through 111d, the structure of which is the same as that of the selector 52 shown in FIG. 2, respectively. Except for this, the structure of each of the macro cells 110a through 110d is the same as that shown in FIGS. 4 and 5.

The fuse 112 includes the pull-up resistor 80, connection section 81, fuse element group 82, and decoder 83 shown in FIG. 3.

The fuse 113 includes the pull-up resistor 84, connection section 85, fuse element group 86, and decoder 87 shown in FIG. 3.

Now, operation in the third embodiment of the present invention will be described.

It is assumed that the fact that a third normal block (the third normal block from the left in FIG. 5) in the macro cell 110a does not work well has become known. Then the fuse element group 86 included in the fuse 113 is fused first into a predetermined pattern by the use of a laser beam to select the macro cell 110a.

The fuse element group 82 included in the fuse 112 is also fused into a predetermined pattern to specify the third normal block.

For example, only a fuse element in the fuse element group 86 in the fuse 113 corresponding to one low-order bit is fused by the use of a laser beam so that "1" indicative of the macro cell 110a will be specified. On the other hand, fuse elements in the fuse element group 82 in the fuse 112 corresponding to two low-order bits are fused so that "3" indicative of the third normal block will be specified.

As a result, output from the fuse element in the fuse element group 86 corresponding to one low-order bit goes into the "L" state and output from the other fuse element in the fuse element group 86 pulled up by the pull-up resistor 84 goes into the "H" state. The decoder 87 supplies data corresponding to these states to the selectors 111a through 111d.

On the other hand, output from each of the fuse elements in the fuse element group 82 corresponding to two low-order bits goes into the "L" state and output from each of the other fuse elements in the fuse element group 82 goes into the "H" state. The decoder 83 supplies data corresponding to these states as a redundant block selection signal.

The data (redundant block selection signal) obtained by decoding by the decoder 83 is supplied to the selectors 111a through 111d included in the macro cells 110a through 110d respectively.

Each of the selectors 111a through 111d refers to the data supplied from the decoder 87 and, in the case of it being selected, imports the data supplied from the decoder 83. In this example, only the fuse element in the fuse element group 86 corresponding to one low-order bit was fused, so the macro cell 110a imports the data output from the decoder 83.

The same process that was described above will be performed in the macro cell 110a. That is to say, each output buffer 74 and the next normal block (or redundant block) on the right side of the normal block just above it will be connected with the third normal block 70b skipped. As a result, the third normal block 70b which does not work well will be replaced with the redundant block 70a.

After the fuse element groups 82 and 86 are fused, the same operation will be performed each time power is applied. That is to say, the third normal block which does not work well will be replaced.

As described above, in the third embodiment of the present invention, the fuse 112 is shared by the plurality of macro cells 110a through 110d. Therefore, the size of a chip can be reduced compared with a case where there is one fuse for each of the macro cells 110a through 110d.

Furthermore, the fuse 113 is included for selecting one of the macro cells 110a through 110d and one of the macro cells 110a through 110d is selected according to the state of the fuse 113. Therefore, after the fuse element group 86 in the fuse 113 being fused, replacement will be made automatically.

Moreover, in the third embodiment the macro cells 110a through 110d include the built-in selectors 111a through 111d respectively. However, a function the macro cells 110a through 110d originally have can be used in place of the function the selectors 111a through 111d carry out. Therefore, the above function can be achieved without adding a new circuit.

In the above embodiment the new fuse 113 must be added. However, the number of fuse elements included in the fuse 113 is smaller than that of fuse elements included in the fuse 112. Therefore, the area of a chip can be reduced compared with a case where there is one fuse 113 for each macro cell.

In addition, in the above embodiment a case where a plurality of macro cells do not work well at the same time cannot be coped with. However, the probability that a plurality of macro cells will not work well concurrently is small, so a yield drop caused by this is almost negligible.

Now, a fourth embodiment of the present invention will be described.

Figure 10:
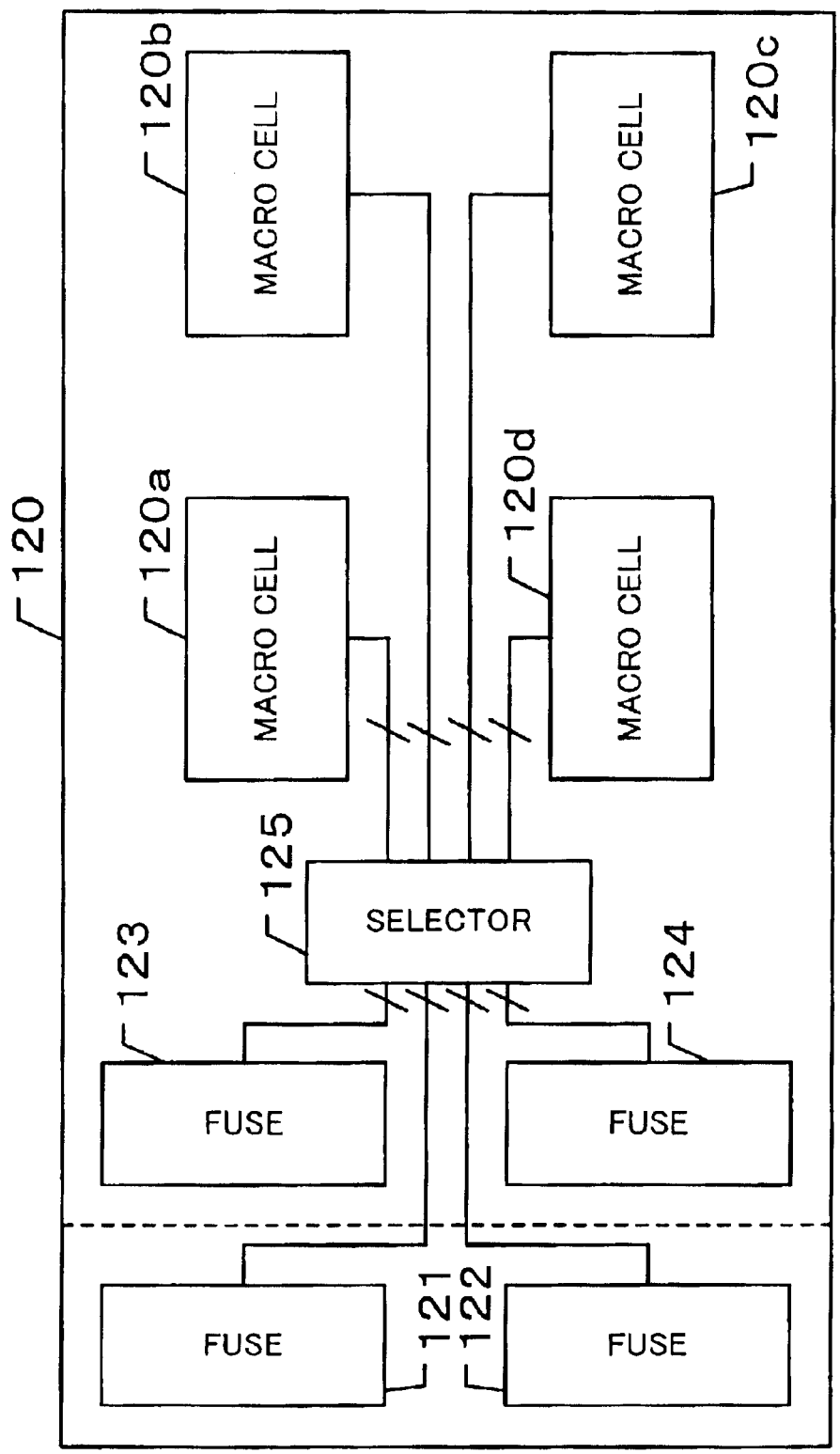
FIG. 10 is a view showing the structure of a fourth embodiment of the present invention.

FIG. 10 is a view showing the structure of a fourth embodiment of the present invention. As shown in FIG. 10, a semiconductor device 120 according to the fourth embodiment of the present invention comprises macro cells 120a through 120d, fuses 121 through 124, and a selector 125.

The structure of each of the macro cells 120a through 120d is the same as that shown in FIGS. 4 and 5.

Each of the fuses 121 through 124 includes the pull-up resistor 80, connection section 81, fuse element group 82, and decoder 83 shown in FIG. 3. The fuses 121 and 122 can be disconnected at need from the semiconductor device 120 proper.

The selector 125 determines how the fuses 121 through 124 should be connected to the macro cells 120a through 120d.

Now, operation in the fourth embodiment of the present invention will be described.

In the beginning stage of mass production, the process for fabricating semiconductor devices and circuits are not fully established and the probability that something will not work well is high. Inconsequence, as shown in FIG. 11(A), the fuses 121 through 124 are connected on a one-to-one basis to the macro cells 120a through 120d by the selector 125 in the beginning stage of mass production. By doing so, a case where two or more of the macro cells 120a through 120d do not work well at the same time can be coped with.

However, when a predetermined period of time has elapsed after the beginning of mass production, the process for fabricating semiconductor devices and the circuits will be fully established and the yield will rise. As a result, the probability that two or more of the macro cells 120a through 120d will not work well at the same time decreases. Therefore, it is not desirable in view of reducing the area of a chip that the fuses 121 through 124 are located on a one-to-one basis for the macro cells 120a through 120d in such a case.

If the process for fabricating semiconductor devices has been established, the fuses 121 and 122 are disconnected at a dashed line shown in FIG. 10 and only the fuses 123 and 124 are used. In this case, the fuse 124 is used for selecting one of the macro cells 120a through 120d. This is the same with the fuse 53 shown in FIG. 2. The fuse 123 is used for specifying a normal block to be replaced.

Figure 11B:
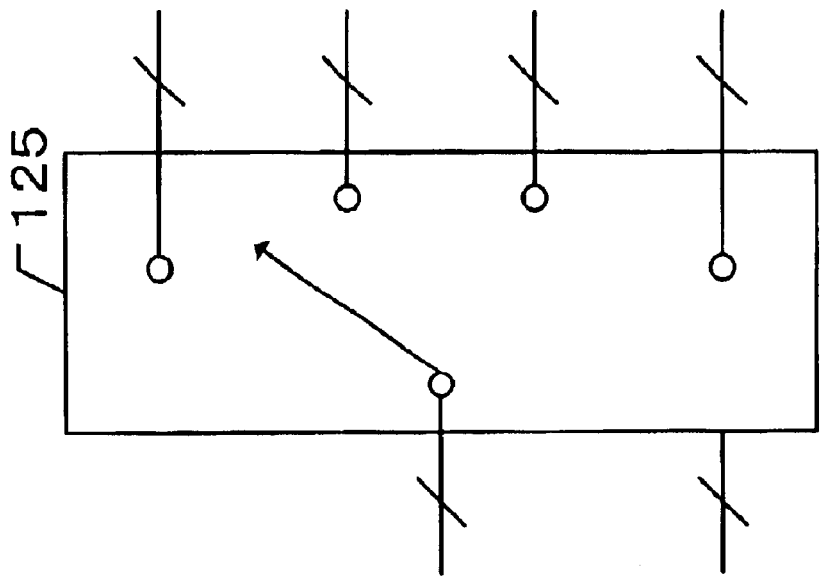
FIG. 11 is a view for describing the principles underlying operation in the fourth embodiment shown in FIG. 10.
Figure 11A:
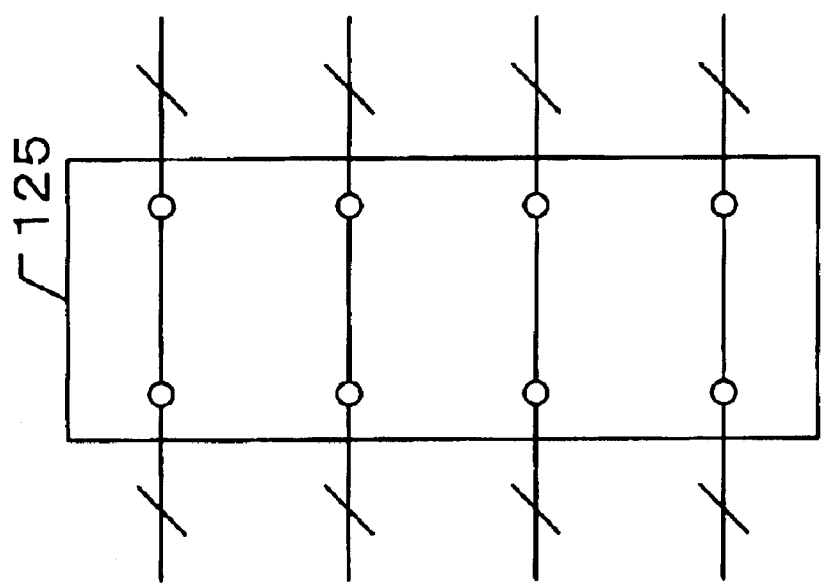

FIG. 11(B) shows how the selector 125 connects the fuses 123 and 124 and the macro cells 120a through 120d in the case of the fuses 121 and 122 being disconnected. As shown in FIG. 11(B), if the fuses 121 and 122 are disconnected, the selector 125 selectively supplies output from the fuse 123 to the macro cells 120a through 120d according to output from the fuse 124. By doing so, the same operation that is performed in the first embodiment shown in FIG. 2 can be performed.

As described above, in the fourth embodiment of the present invention, the number of fuses can be changed according to the extent to which the process for fabricating semiconductor devices has been established.

Now, a fifth embodiment of the present invention will be described.

Figure 12:
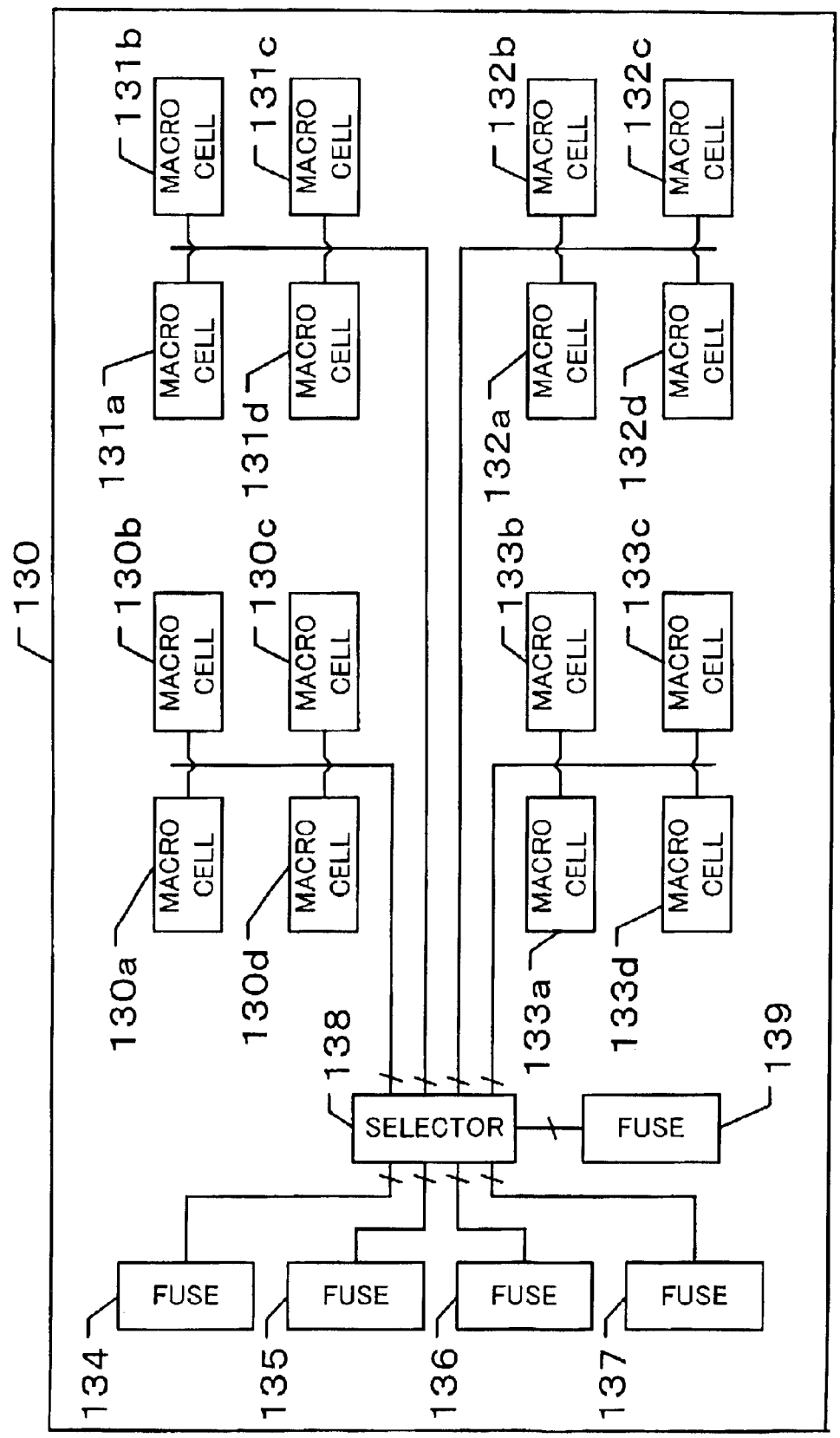
FIG. 12 is a view showing the structure of a fifth embodiment of the present invention.

FIG. 12 is a view showing the structure of a fifth embodiment of the present invention. As shown in FIG. 12, a semiconductor device 130 according to the fifth embodiment of the present invention comprises macro cells 130a through 130d, macro cells 131a through 131d, macro cells 132a through 132d, macro cells 133a through 133d, fuses 134 through 137, a selector 138, and a fuse 139.

The structure of each of the macro cells 130a through 130d, macro cells 131a through 131d, macro cells 132a through 132d, and macro cells 133a through 133d is the same as that shown in FIGS. 4 and 5.

Each of the fuses 134 through 137 includes the pull-up resistor 80, connection section 81, fuse element group 82, and decoder 83 shown in FIG. 3.

The selector 138 determines according to data supplied from the fuse 139 how the fuses 134 through 137 should be connected to the macro cells 130a through 130d, macro cells 131a through 131d, macro cells 132a through 132d, and macro cells 133a through 133d.

The fuse 139 includes the pull-up resistor 80, connection section 81, fuse element group 82, and decoder 83 shown in FIG. 3. The number of fuse elements in the fuse element group 82 must be changed properly according to the total number of macro cells.

Now, operation in the above fifth embodiment will be described.

In the fifth embodiment shown in FIG. 12, the fuses 134 through 137 can be connected on a one-to-one basis to a group made up of the macro cells 130a through 130d, a group made up of the macro cells 131a through 131d, a group made up of the macro cells 132a through 132d, and a group made up of the macro cells 133a through 133d. Two or more fuses can also be connected to a group of macro cells.

That is to say, in the fifth embodiment of the present invention, signal lines from macro cells included in groups of macro cells (the macro cells 130a through 130d, macro cells 131a through 131d, macro cells 132a through 132d, and macro cells 133a through 133d) run in parallel and are connected to the selector 138. Therefore, the fuses 134 through 137 can be connected on a one-to-one basis to macro cells included in a group of macro cells. One fuse can also be connected to all the macro cells included in a group of macro cells.

Figure 13B:
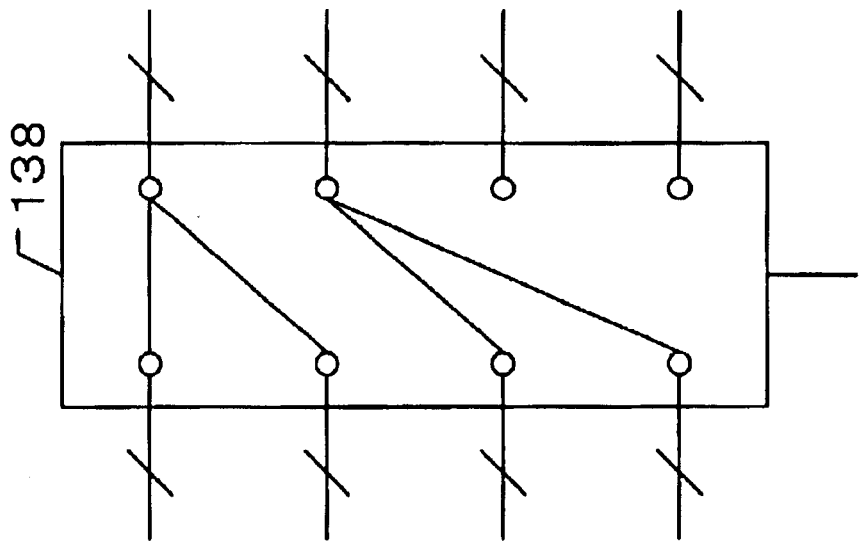
FIGS. 13(A) and 13(B) are views for describing the principles underlying operation in the fifth embodiment shown in FIG. 12.
Figure 13A:
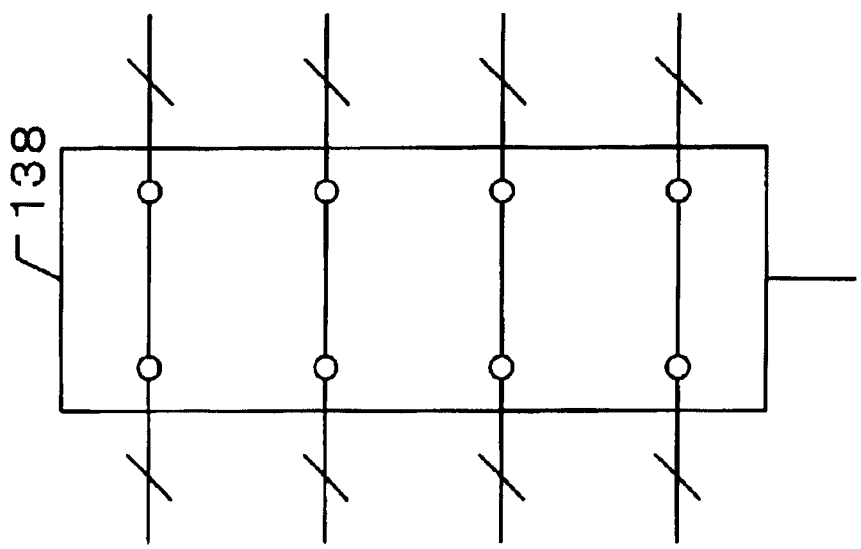
Figure 14:
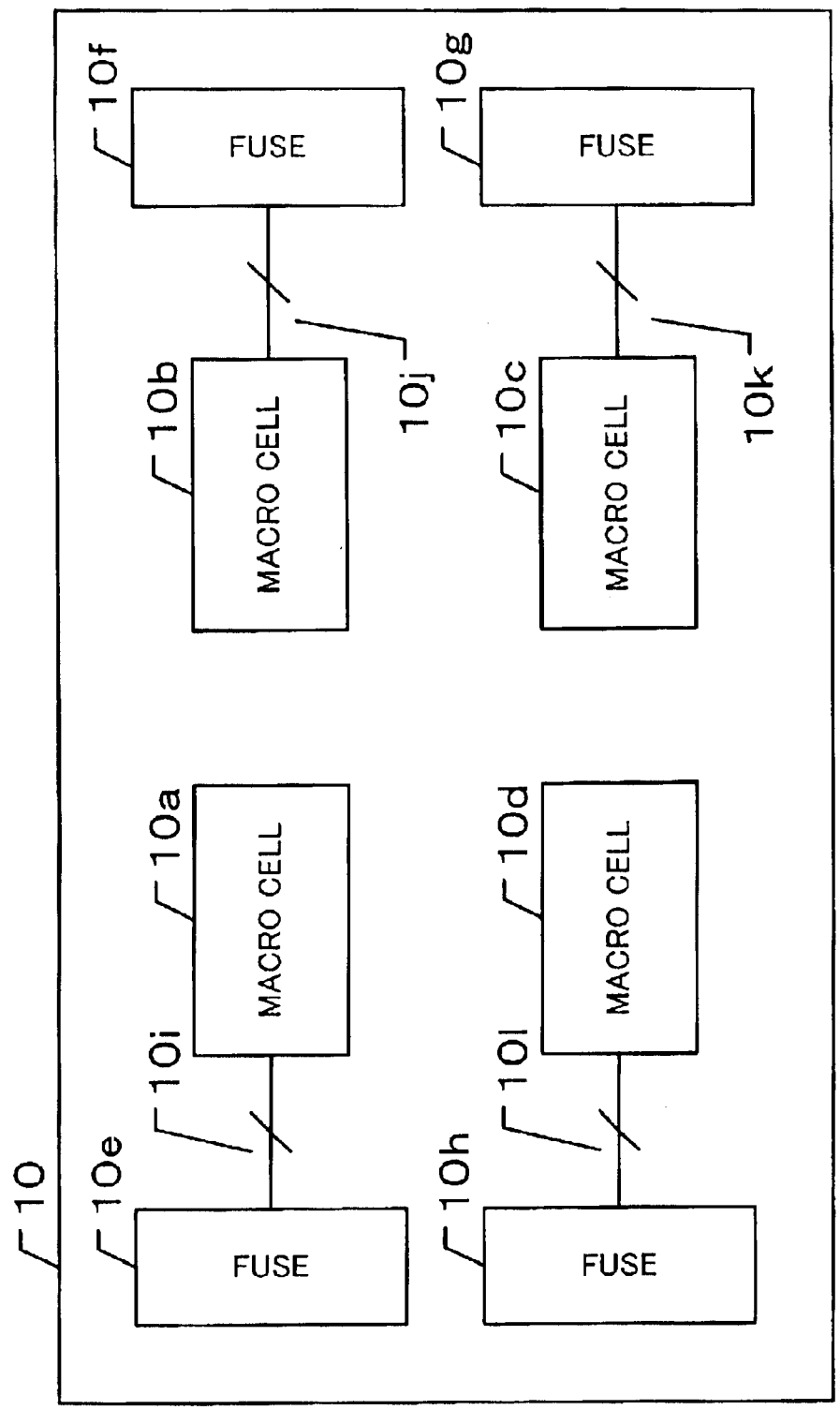
FIG. 14 is a view showing the structure of a conventional semiconductor device.
Figure 15:
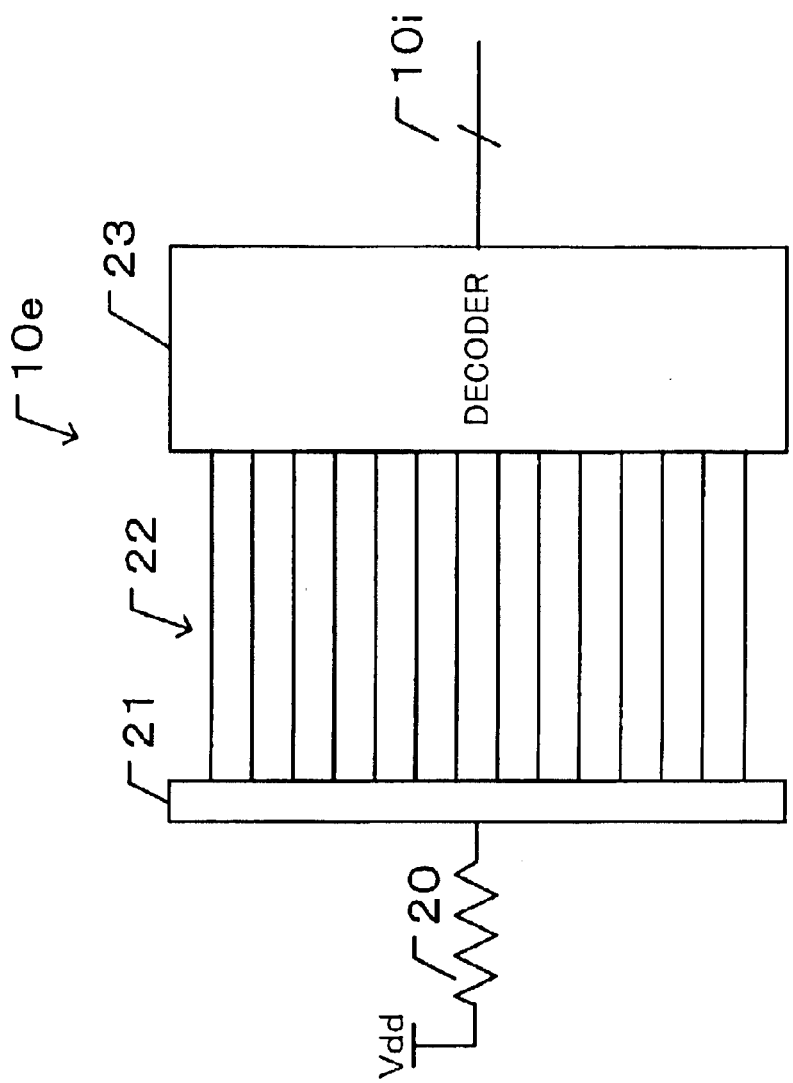
FIG. 15 is a view showing the structure of the fuses shown in FIG. 14.

In FIG. 13(A), the fuses 134 through 137 are connected on a one-to-one basis to a group made up of the macro cells 130a through 130d, a group made up of the macro cells 131a through 131d, a group made up of the macro cells 132a through 132d, and a group made up of the macro cells 133a through 133d. FIG. 13(A) is simplified. Actually, a fuse is connected to each macro cell included in a group of macro cells.

By adopting this connection method, the same replacement operation that is performed in the second embodiment shown in FIG. 6 can be achieved. That is to say, as shown in FIG. 8, if a normal block in one of a group of macro cells does not work well, normal blocks in all the macro cells corresponding to the normal block which does not work well are replaced with redundant blocks. As a result, the macro cell which does not work well can be remedied.

On the other hand, in FIG. 13(B) the fuses 134 and 135 are connected to a group made up of the macro cells 130a through 130d and the fuses 136 and 137 are connected to a group made up of the macro cells 131a through 131d. To be concrete, this means that, for example, the fuses 134 through 137 are connected to the macro cells 130a, 130c, 131c, and 131d respectively.

In the above embodiment, zero, one or more fuses can be connected by the group made up of a plurality of macro cells. Therefore, even if a plurality of macro cells in one of groups do not work well, they can be remedied by making use of a fuse not used by the other groups.

As shown in FIGS. 4 and 5, the above descriptions have been given with a case where the column circuit 61 selects the normal block 70b which does not work well as an example. However, the decoder 62 may select a normal block which does not work well.

Furthermore, as shown in FIG. 4, a macro cell includes one cell array 60, one column circuit 61, one decoder 62, and one CPG 63. However, a macro cell may include two cell arrays and two column circuits which share one decoder 62 and one CPG 63.

The circuits shown in the above embodiments are simple examples. It is a matter of course that the scope of the present invention is not limited to these cases.

As has been described in the foregoing, in the present invention, a fuse is shared by a plurality of macro cells each having a plurality of normal blocks and a redundant block. Therefore, by removing an unnecessary fuse, the size of a semiconductor device can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
   a plurality of macro cells each including a plurality of normal blocks each including circuits each having a predetermined function and a redundant block having the same function as the normal blocks have and used, in the case of one of the normal blocks not working well, in place of the normal block and;
   a fuse for holding information for specifying the normal block to be replaced with the redundant block included in the macro cell,
   wherein the fuse is shared by the plurality of macro cells.

2. The semiconductor device according to claim 1, further comprising a selection circuit for selecting a predetermined macro cell to be connected to the fuse.

3. The semiconductor device according to claim 2, wherein the selection circuit selects the predetermined macro cell to be connected to the fuse based on another fuse for determining a connection method.

4. The semiconductor device according to claim 2, wherein each of the plurality of the macro cells has the selection circuit built-in.

5. The semiconductor device according to claim 2, wherein a plurality of fuses and the plurality of macro cells are connected via the selection circuit.

6. The semiconductor device according to claim 5, wherein part of the plurality of fuses can be disconnected.

7. The semiconductor device according to claim 1, wherein if the normal block which does not work well is included in one of the plurality of macro cells which share the fuse, not only is the normal block in the one of the plurality of macro cells replaced with the redundant block by the fuse, but the corresponding normal blocks in the other macro cells are also replaced with the redundant blocks by the fuse.

* * * * *